United States Patent
Li et al.

(10) Patent No.: US 10,725,579 B2
(45) Date of Patent: Jul. 28, 2020

(54) COMPENSATION CIRCUIT, GATE DRIVING UNIT, GATE DRIVING CIRCUIT, DRIVING METHODS THEREOF AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Feng Li, Beijing (CN); Liang Zhang, Beijing (CN); Yu Ma, Beijing (CN); Qi Sang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 255 days.

(21) Appl. No.: 15/936,522

(22) Filed: Mar. 27, 2018

(65) Prior Publication Data

US 2019/0129560 A1 May 2, 2019

(30) Foreign Application Priority Data

Oct. 31, 2017 (CN) .......................... 2017 1 1046736

(51) Int. Cl.
*G06F 3/041* (2006.01)
*G09G 3/36* (2006.01)
*G11C 19/28* (2006.01)
*G09G 3/3266* (2016.01)

(52) U.S. Cl.
CPC ......... *G06F 3/0416* (2013.01); *G09G 3/3266* (2013.01); *G09G 3/3677* (2013.01); *G11C 19/28* (2013.01); *G06F 3/0412* (2013.01); *G09G 2300/0819* (2013.01); *G09G 2310/0286* (2013.01)

(58) Field of Classification Search
CPC .. G06F 3/0416; G09G 3/3266; G09G 3/3677; G09G 2310/0286; G11C 19/28
See application file for complete search history.

(56) References Cited

U.S. PATENT DOCUMENTS 8,982,020 B2 3/2015 Sun et al.
2017/0235406 A1 8/2017 Su et al.

FOREIGN PATENT DOCUMENTS

CN 105528988 A 4/2016
CN 106020535 A 10/2016

OTHER PUBLICATIONS

First Office Action for Chinese Application No. 201711046736.2, dated Oct. 14, 2019, 10 Pages.

*Primary Examiner* — Michael Pervan
(74) *Attorney, Agent, or Firm* — Brooks Kushman P.C.

(57) ABSTRACT

A compensation circuit, a gate driving unit, a gate driving method, driving method thereof, and a display device are provided. The compensation circuit includes: a pull-up control node control sub-circuit configured to control a touch ending signal input end to input a touch ending signal to a pull-up control node under the control of a pull-up input end; a pull-up control storage capacitor sub-circuit, a first end of which is connected to the pull-up input end, and a second end of which is connected to the pull-up control node; and a compensation sub-circuit configured to enable the pull-up control node to be electrically connected to the pull-up node voltage output end under the control of the pull-up control node.

13 Claims, 4 Drawing Sheets

COMPENSATION CIRCUIT, GATE DRIVING UNIT, GATE DRIVING CIRCUIT, DRIVING METHODS THEREOF AND DISPLAY DEVICE

CROSS-REFERENCE TO RELATED APPLICATION

This application claims priority to Chinese Patent Application No. 201711046736.2 filed on Oct. 31, 2017, which is incorporated herein by reference in its entirety.

TECHNICAL FIELD

The present disclosure relates to the field of display driving technology, in particular to a compensation circuit, a gate driving unit, a gate driving circuit, driving methods thereof and a display device.

BACKGROUND

Currently, a Gate On Array (GOA) circuit has been widely used in a display device, e.g., Thin Film Transistor-Liquid Crystal Display (TFT-LCD) display or Active-Matrix Organic Light-Emitting Diode (AMOLED) display, due to such advantages as small volume, low cost and high integration level. In the related art, during low-frequency output, a potential at a pull-up node of a gate driving unit may decrease.

For the GOA circuit associated with Touch Display Driver Integration (TDDI), a touch stage is provided between two display stages. When performing a touch scanning operation at the touch stage, the GOA circuit needs to stop performing a display driving scanning operation and then perform the display driving scanning operation after a touch operation, so as to perform the touch operation and a display operation alternately. Assuming that the GOA circuit is of a 2CLK structure (i.e., it includes two clock signal lines), the touch stage starts after a gate driving signal is outputted by a gate driving unit in an $N^{th}$ row. At this time, a potential at a pull-up node of a gate driving unit in an $(N+1)^{th}$ row is changed to be a high level and maintained at the high level until the touch stage is ended, where N is a positive integer greater than 1. The gate driving signal is outputted after a voltage is applied to the clock signal line. The touch stage is maintained for a relatively long time period (usually hundreds of microseconds), so the potential at the pull-up node of the gate driving unit may be pulled down due to a leakage current of a TFT. When the potential at the pull-up node decreases gradually, the output of the gate driving signal from the gate driving unit in the $(N+1)^{th}$ row may be adversely affected.

SUMMARY

A main object of the present disclosure is to provide a compensation circuit, a gate driving unit, a gate driving circuit, gate driving methods thereof and a display device, so as to solve the technical problem in the related art where it is impossible to output the corresponding gate driving signal in the case that the potential at the pull-up node of the gate driving unit is pulled down due to the touch stage or the low-frequency output, thereby to achieve normal display.

In one aspect, the present disclosure provides in some embodiments a compensation circuit, including a touch ending signal input end, a pull-up input end and a pull-up node voltage output end. The compensation circuit further includes: a pull-up control node control sub-circuit connected to the touch ending signal input end, the pull-up input end and a pull-up control node, and configured to control the touch ending signal input end to input a touch ending signal to the pull-up control node under the control of the pull-up input end; a pull-up control storage capacitor sub-circuit, a first end of which is connected to the pull-up input end, and a second end of which is connected to the pull-up control node; and a compensation sub-circuit connected to the pull-up control node and the pull-up node voltage output end, and configured to enable the pull-up control node to be electrically connected to the pull-up node voltage output end under the control of the pull-up control node.

In a possible embodiment of the present disclosure, the pull-up control node control sub-circuit includes a pull-up node control transistor, a gate electrode of which is connected to the pull-up input end, a first electrode of which is connected to the touch ending signal input end, and a second electrode of which is connected to the pull-up control node.

In a possible embodiment of the present disclosure, the compensation sub-circuit includes a compensation transistor, a gate electrode and a first electrode of which are connected to the pull-up control node, and a second electrode of which is connected to the pull-up node voltage output end.

In a possible embodiment of the present disclosure, the pull-up control storage capacitor sub-circuit includes a pull-up control storage capacitor, a first end of which is connected to the pull-up input end, and a second end of which is connected to the pull-up control node.

In another aspect, the present disclosure provides in some embodiments a gate driving unit includes a shift register unit circuit and the above-mentioned compensation circuit. A pull-up input end of the compensation circuit is connected to a pull-up node of a previous-level gate driving unit, a pull-up node output end of the compensation circuit is connected to a pull-up node of the shift register unit circuit, and a touch ending signal input end of the compensation circuit is connected to a touch ending signal line.

In a possible embodiment of the present disclosure, the shift register unit circuit includes an input end, a resetting end, a clock signal input end, the pull-up node, a pull-down node, a gate driving signal output end, an input sub-circuit, a pull-up resetting sub-circuit, a pull-up node control sub-circuit, a pull-down node control sub-circuit, a shift storage capacitor sub-circuit, an output sub-circuit and an output resetting sub-circuit. The input sub-circuit is connected to the input end, a first voltage input end and the pull-up node, and configured to control the first voltage input end to input a first voltage to the pull-up node under the control of the input end. The pull-up resetting sub-circuit is connected to the resetting end, a second voltage input end and the pull-up node, and configured to control the second voltage input end to input a second voltage to the pull-up node under the control of the resetting end. The pull-up node control sub-circuit is connected to the pull-up node, the pull-down node and a third voltage input end, and configured to control the third voltage input end to input a third voltage to the pull-up node under the control of the pull-down node. The pull-down node control sub-circuit is connected to the pull-up node, the pull-down node, the third voltage input end and a fourth voltage input end, and configured to control a potential at the pull-down node under the control of the pull-up node. A first end of the shift storage capacitor sub-circuit is connected to the pull-up node, and a second end thereof is connected to the gate driving signal output end. The output sub-circuit is connected to the gate driving signal output end, the pull-up node and the clock signal input end, and configured to control the clock signal input end to input a clock signal to the gate driving signal output end under the control of the pull-up node. The output resetting sub-circuit is connected to the gate driving signal output end, the pull-down node and the third voltage input end, and configured to control the third voltage input end to output the third voltage to the gate driving signal output end under the control of the pull-down node. The input end is connected to a gate driving signal output end of the previous-level gate driving unit. The resetting end is connected to a gate driving signal output end of a next-level gate driving unit.

In a possible embodiment of the present disclosure, the first voltage is a first high voltage, the second voltage is a first low voltage, the third voltage is a second low voltage, and the fourth voltage is a second high voltage.

In yet another aspect, the present disclosure provides in some embodiments a method for driving the above-mentioned gate driving unit, including a step of controlling, by a compensation circuit, a potential at a pull-up node voltage output end under the control of a pull-up input end and a touch ending signal input end, so as to control a potential at a pull-up node of a shift register unit circuit of the gate driving unit.

In a possible embodiment of the present disclosure, each driving period includes at least one touch stage, and the touch stage includes a maintenance time period and a voltage compensation time period. The driving method includes: within the maintenance time period of the touch stage, maintaining, by the compensation circuit, the potential at the pull-up node voltage output end under the control of the pull-up input end and the touch ending signal input end; and within the voltage compensation time period of the touch stage, pulling up, by the compensation circuit, the potential at the pull-up node voltage output end under the control of the pull-up input end and the touch ending signal input end.

In a possible embodiment of the present disclosure, the shift register unit circuit of the gate driving unit includes an input end, a resetting end, a clock signal input end, the pull-up node, a pull-down node, a gate driving signal output end, an input sub-circuit, a pull-up resetting sub-circuit, a pull-up node control sub-circuit, a pull-down node control sub-circuit, a shift storage capacitor sub-circuit, an output sub-circuit and an output setting sub-circuit. Each driving period further includes a display stage. The driving method further includes: within an input time period of the display stage, pulling up, by the input sub-circuit, the potential at the pull-up node under the control of the input end; within an output time period of the display stage, bootstrapping, by the shift storage capacitor sub-circuit, the potential at the pull-up node, and controlling, by the output sub-circuit, the clock signal input end to input a clock signal to the gate driving signal output end, so as to output a corresponding gate driving signal through the gate driving signal output end; and within a resetting time period of the display stage, resetting, by the pull-up resetting sub-circuit, the potential at the pull-up node under the control of the resetting end, pulling up, by the pull-down node control sub-circuit, a potential at the pull-down node, maintaining, by the pull-up node control sub-circuit, the potential at the pull-up node, and resetting, by the output resetting sub-circuit, the gate driving signal under the control of the pull-down node.

In still yet another aspect, the present disclosure provides in some embodiments a gate driving circuit including at least one level of the above-mentioned gate driving unit.

In still yet another aspect, the present disclosure provides in some embodiments a gate driving method for use in the above-mentioned gate driving circuit. Each driving period includes a touch stage, and the touch stage includes a maintenance time period and a voltage compensation time period. The gate driving method includes steps of: entering the touch stage after a corresponding gate driving signal is outputted by a previous-level gate driving unit; performing a touch scanning operation at the touch stage; within the maintenance time period of the touch stage, maintaining, by a compensation circuit of a next-level gate driving unit, a potential at a pull-up node voltage output end of the compensation circuit under the control of a pull-up node of a current-level gate driving unit and a touch ending signal input end of the compensation circuit of the next-level gate driving unit; and within the voltage compensation time period of the touch stage, pulling, by the compensation circuit, the potential at the pull-up node voltage output end under the control of the pull-up node and the touch ending signal input end.

In a possible embodiment of the present disclosure, each driving period further includes a display stage subsequent to the voltage compensation time period. The gate driving method further includes: at the display stage, stopping the touch scanning operation; and within a first-row display time period of the display stage, outputting, by a shift register unit circuit of the next-level gate driving unit, a corresponding gate driving signal under the control of the pull-up node voltage output end.

In a possible embodiment of the present disclosure, the gate driving method further includes enabling the gate driving circuit to start and end the touch stage through a shift clock signal line and a touch ending signal line.

In still yet another aspect, the present disclosure provides in some embodiments a display device including the above-mentioned gate driving circuit.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be TFTs, field effect transistors (FETs) or any other elements having an identical characteristic. In the embodiments of the present disclosure, in order to differentiate two electrodes other than a gate electrode from each other, one of them is called as first electrode and the other is called as second electrode. In actual use, the first electrode may be a drain electrode while the second electrode may be a source electrode, or the first electrode may be a source electrode while the second electrode may be a drain electrode.

Figure 1:
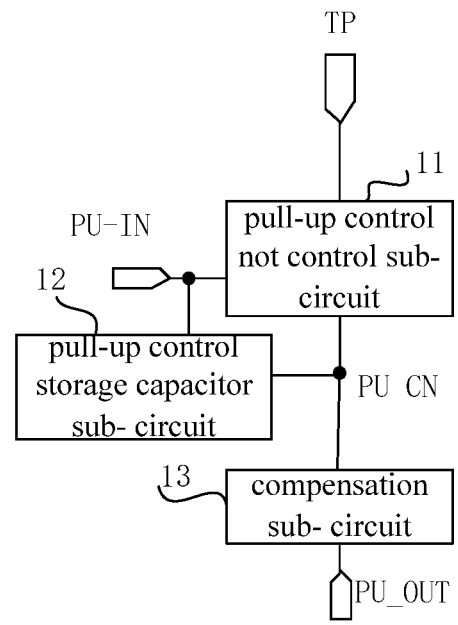
FIG. 1 is a block diagram of a compensation circuit according to one embodiment of the present disclosure.

The present disclosure provides in some embodiments a compensation circuit which, as shown in FIG. 1, includes a touch ending signal input end TP, a pull-up input end PU-IN and a pull-up node voltage output end PU-OUT. The compensation circuit further includes: a pull-up control node control sub-circuit 11 connected to the touch ending signal input end TP, the pull-up input end PU-IN and a pull-up control node PU_CN, and configured to control the touch ending signal input end TP to input a touch ending signal to the pull-up control node PU_CN under the control of the pull-up input end PU-IN; a pull-up control storage capacitor sub-circuit 12, a first end of which is connected to the pull-up input end PU-IN, and a second end of which is connected to the pull-up control node PU_CN; and a compensation sub-circuit 13 connected to the pull-up control node PU_CN and the pull-up node voltage output end PU-OUT, and configured to enable the pull-up control node PU_CN to be electrically connected to the pull-up node voltage output end PU-OUT under the control of the pull-up control node PU_CN.

According to the embodiments of the present disclosure, the compensation circuit includes the pull-up control node control sub-circuit 11, the pull-up control storage capacitor sub-circuit 12 and the compensation sub-circuit 13. The compensation circuit pulls up the potential at the pull-up node voltage output end PU-OUT at a specific time point under the control of the pull-up input end PU-IN and the touch ending signal input end TP. As a result, it is able to pull up the potential at the pull-up node through the pull-up node voltage output end PU-OUT in the case that a potential at a pull-up node of a shift register unit circuit of a gate driving unit is pulled down due to a touch stage or low-frequency output, thereby to enable the gate driving unit to output a corresponding gate driving signal normally and ensure a normal display effect.

In the embodiments of the present disclosure, the pull-up control node control sub-circuit 11 may control the touch ending signal input end TP to input the touch ending signal to the pull-up control node PU_CN under the control of the pull-up input end PU-IN. To be specific, when the potential at the pull-up input end PU-IN is within a first predetermined range (which may be set in accordance with the practical need), the pull-up control node control sub-circuit 11 may control the touch ending signal input end TP to input the touch ending signal to the pull-up control node PU_CN. When the potential at the pull-up input end PU-IN is not within the first predetermined range, the pull-up control node control sub-circuit 11 may control the touch ending signal input end TP to be electrically disconnected from the pull-up control node PU_CN.

The compensation sub-circuit 13 may control the pull-up control node PU_CN to be electrically connected to the pull-up node voltage output end PU-OUT under the control of the pull-up control node PU_CN. To be specific, when the potential at the pull-up control node PU_CN is within a second predetermined range (which is set in accordance with the practical need), the compensation sub-circuit 13 may control the pull-up control node PU_CN to be electrically connected to the pull-up node voltage output end PU-OUT. When the potential at the pull-up control node PU_CN is not within the second predetermined range, the compensation sub-circuit 13 may control the pull-up control node PU_CN to be electrically disconnected from the pull-up node voltage output end PU-OUT.

In actual use, the pull-up control node control sub-circuit may include a pull-up node control transistor, a gate electrode of which is connected to the pull-up input end, a first electrode of which is connected to the touch ending signal input end, and a second electrode of which is connected to the pull-up control node.

In actual use, the compensation sub-circuit may include a compensation transistor, a gate electrode and a first electrode of which are connected to the pull-up control node, and a second electrode of which is connected to the pull-up node voltage output end.

In actual use, the pull-up control storage capacitor sub-circuit may include a pull-up control storage capacitor, a first end of which is connected to the pull-up input end, and a second end of which is connected to the pull-up control node.

The compensation circuit will be described hereinafter in conjunction with the embodiments.

Figure 2:
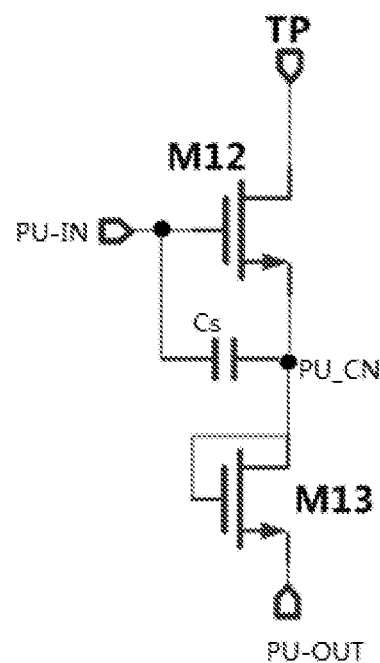
FIG. 2 is a circuit diagram of the compensation circuit according to one embodiment of the present disclosure.

As shown in FIG. 2, the compensation circuit includes the pull-up control node control sub-circuit, the pull-up control storage capacitor sub-circuit and the compensation sub-circuit.

The pull-up control node control sub-circuit includes a pull-up node control transistor M12, a gate electrode of which is connected to the pull-up input end PU-IN, a drain electrode of which is connected to the touch ending signal input end TP, and a source electrode of which is connected to the pull-up control node PU_CN.

The compensation sub-circuit includes a compensation transistor M13, a gate electrode and a drain electrode of which are connected to the pull-up control node PU_CN, and a source electrode of which is connected to the pull-up node voltage output end PU-OUT.

The pull-up control storage capacitor sub-circuit includes a pull-up control storage capacitor Cs, a first end of which is connected to the pull-up input end PU-IN, and a second end of which is connected to the pull-up control node PU_CN.

In FIG. 2, M12 and M13 are both n-type transistors. However, in actual use, these transistors may also be p-type transistors, i.e., the types of the transistors will not be particularly defined herein.

During the operation of the compensation circuit in FIG. 2, when it is necessary to pull up the potential at PU-OUT, a high level is inputted to TP. At this time, a potential at PU-IN may be a high level, so M12 is turned on so as to pull up a potential at PU_CN to be a high level, thereby to turn on M13. PU-OUT is charged via the on-state M13, so as to pull up the potential at PU-OUT.

The present disclosure further provides in some embodiments a gate driving unit including a shift register unit circuit and the above-mentioned compensation circuit. A pull-up input end of the compensation circuit is connected to a pull-up node of a previous-level gate driving unit, a pull-up node output end of the compensation circuit is connected to a pull-up node of the shift register unit circuit, and a touch ending signal input end of the compensation circuit is connected to a touch ending signal line.

According to the gate driving unit in the embodiments of the present disclosure, the pull-up node voltage output end of the compensation circuit is connected to the pull-up node of the shift register unit circuit, and the pull-up input end of the compensation circuit is connected to the pull-up node of the previous-level gate driving unit. Through the compensation circuit, it is able to pull up the potential at the pull-up node voltage output end at a specific time point, thereby to pull up the potential at the pull-up node of the shift register unit circuit of the gate driving unit.

Figure 3:
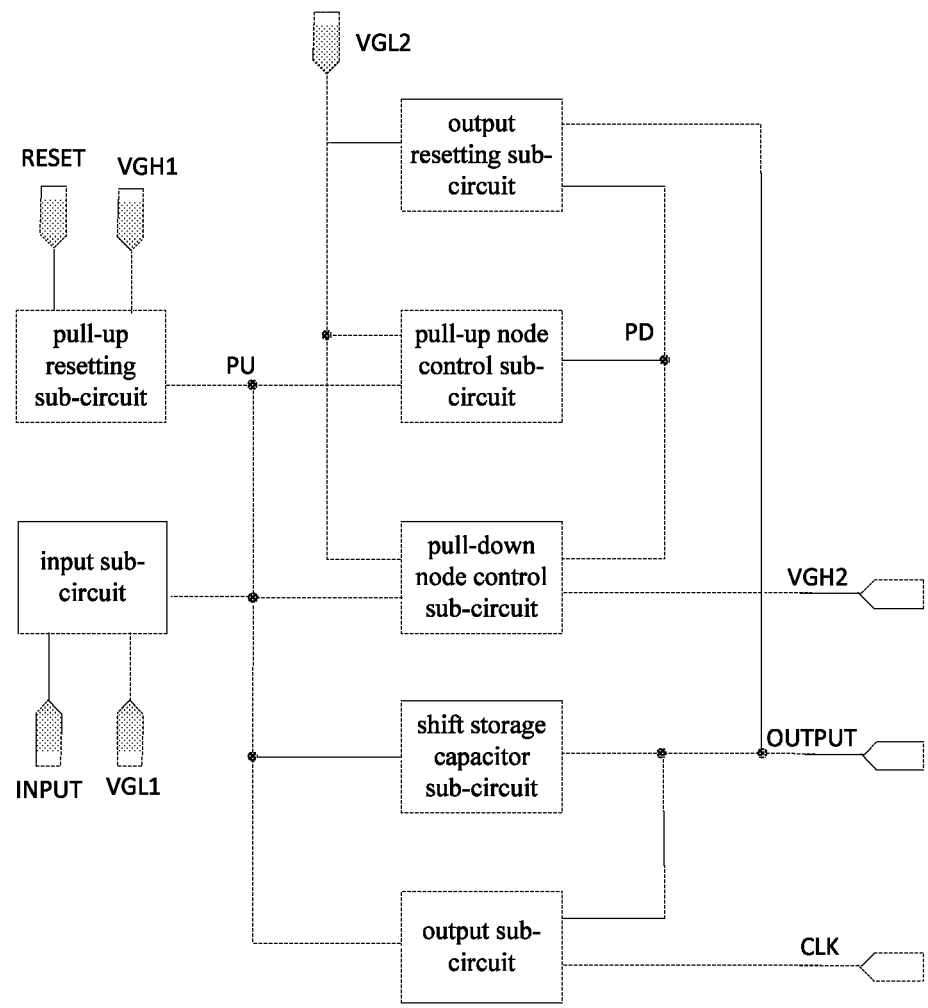
FIG. 3 is a schematic view showing a shift register unit circuit according to one embodiment of the present disclosure.

To be specific, as shown in FIG. 3, the shift register unit circuit may include an input end INPUT, a resetting end RESET, a clock signal input end CLK, the pull-up node PU, a pull-down node PD, a gate driving signal output end OUTPUT, an input sub-circuit, a pull-up resetting sub-circuit, a pull-up node control sub-circuit, a pull-down node control sub-circuit, a shift storage capacitor sub-circuit, an output sub-circuit and an output resetting sub-circuit. The input sub-circuit is connected to the input end, a first voltage input end V1 and the pull-up node, and configured to control the first voltage input end to input a first voltage to the pull-up node under the control of the input end. The pull-up resetting sub-circuit is connected to the resetting end, a second voltage input end V2 and the pull-up node, and configured to control the second voltage input end to input a second voltage to the pull-up node under the control of the resetting end. The pull-up node control sub-circuit is connected to the pull-up node, the pull-down node and a third voltage input end, and configured to control the third voltage input end to input a third voltage to the pull-up node under the control of the pull-down node. The pull-down node control sub-circuit is connected to the pull-up node, the pull-down node, the third voltage input end and a fourth voltage input end, and configured to control a potential at the pull-down node under the control of the pull-up node. A first end of the shift storage capacitor sub-circuit is connected to the pull-up node, and a second end thereof is connected to the gate driving signal output end. The output sub-circuit is connected to the gate driving signal output end, the pull-up node and the clock signal input end, and configured to control the clock signal input end to input a clock signal to the gate driving signal output end under the control of the pull-up node. The output resetting sub-circuit is connected to the gate driving signal output end, the pull-down node and the third voltage input end, and configured to control the third voltage input end to output the third voltage to the gate driving signal output end under the control of the pull-down node. The input end is connected to a gate driving signal output end of the previous-level gate driving unit. The resetting end is connected to a gate driving signal output end of a next-level gate driving unit.

In the embodiments of the present disclosure, the shift register unit circuit may be of a structure identical to a conventional gate driving unit.

In actual use, the first voltage may be a first high voltage, the second voltage may be a first low voltage, the third voltage may be a second low voltage, and the fourth voltage may be a second high voltage. Of course, these voltages may not be limited thereto.

The present disclosure further provides in some embodiments a method for driving the above-mentioned gate driving unit, including a step of controlling, by a compensation circuit, a potential at a pull-up node voltage output end under the control of a pull-up input end and a touch ending signal input end, so as to control a potential at a pull-up node of a shift register unit circuit of the gate driving unit.

According to the driving method in the embodiments of the present disclosure, the potential at the pull-up node voltage output end is controlled by the compensation circuit, so as to control the potential at the pull-up node of the shift register unit circuit of the gate driving unit. As a result, it is able to pull up the potential at the pull-up node through the pull-up node voltage output end when the potential at the pull-up node of the shift register unit circuit of the gate driving unit is pulled down due to a touch stage or low-frequency output, thereby to enable the gate driving unit to output a corresponding gate driving signal normally and ensure a normal display effect.

To be specific, each driving period includes at least one touch stage, and the touch stage includes a maintenance time period and a voltage compensation time period. The driving method includes: within the maintenance time period of the touch stage, maintaining, by the compensation circuit, the potential at the pull-up node voltage output end under the control of the pull-up input end and the touch ending signal input end; and within the voltage compensation time period of the touch stage, pulling up, by the compensation circuit, the potential at the pull-up node voltage output end under the control of the pull-up input end and the touch ending signal input end.

In actual use, the touch stage includes the maintenance time period and the voltage compensation time period. Within the voltage compensation time period, the compensation circuit may pull up the potential at the pull-up node voltage output end under the control of the pull-up input end and the touch ending signal input end, so as to pull up the potential at the pull-up node of the shift register unit circuit of the gate driving unit. As a result, it is able to pull up the potential at the pull-up node through the pull-up node voltage output end when the potential at the pull-up node of the shift register unit circuit of the gate driving unit is pulled down due to a touch stage, thereby to enable the gate driving unit to output a corresponding gate driving signal normally and ensure a normal display effect.

To be specific, the shift register unit circuit of the gate driving unit includes an input end, a resetting end, a clock signal input end, the pull-up node, a pull-down node, a gate driving signal output end, an input sub-circuit, a pull-up resetting sub-circuit, a pull-up node control sub-circuit, a pull-down node control sub-circuit, a shift storage capacitor sub-circuit, an output sub-circuit and an output setting sub-circuit. Each driving period further includes a display stage. The driving method further includes: within an input time period of the display stage, pulling up, by the input sub-circuit, the potential at the pull-up node under the control of the input end; within an output time period of the display stage, bootstrapping, by the shift storage capacitor sub-circuit, the potential at the pull-up node, and controlling, by the output sub-circuit, the clock signal input end to input a clock signal to the gate driving signal output end, so as to output a corresponding gate driving signal through the gate driving signal output end; and within a resetting time period of the display stage, resetting, by the pull-up resetting sub-circuit, the potential at the pull-up node under the control of the resetting end, pulling up, by the pull-down node control sub-circuit, a potential at the pull-down node, maintaining, by the pull-up node control sub-circuit, the potential at the pull-up node, and resetting, by the output resetting sub-circuit, the gate driving signal under the control of the pull-down node.

In actual use, an operating procedure of the shift register unit circuit at the display stage may be identical to that of the conventional gate driving circuit at the display stage.

The present disclosure further provides in some embodiments a gate driving circuit including at least one level of the above-mentioned gate driving unit.

In a possible embodiment of the present disclosure, for the gate driving circuit, merely a next-level gate driving unit adjacent to a gate driving unit that finally outputs the corresponding gate driving signal from the display stage to the touch stage may be set as the above-mentioned gate driving unit, and the other gate driving units may be of a structure identical to the conventional gate driving unit.

In another possible embodiment of the present disclosure, each of the gate driving units of the gate driving circuit may be set as the above-mentioned gate driving unit, and the touch ending signal and the shift clock signal may be changed so as to perform a touch operation after the gate driving unit in any row has outputted the corresponding gate driving signal, and meanwhile ensure an output effect of the gate driving signal.

The gate driving circuit will be described hereinafter in conjunction with the embodiments.

In a first embodiment, the gate driving circuit includes a plurality of levels of gate driving units.

Figure 4:
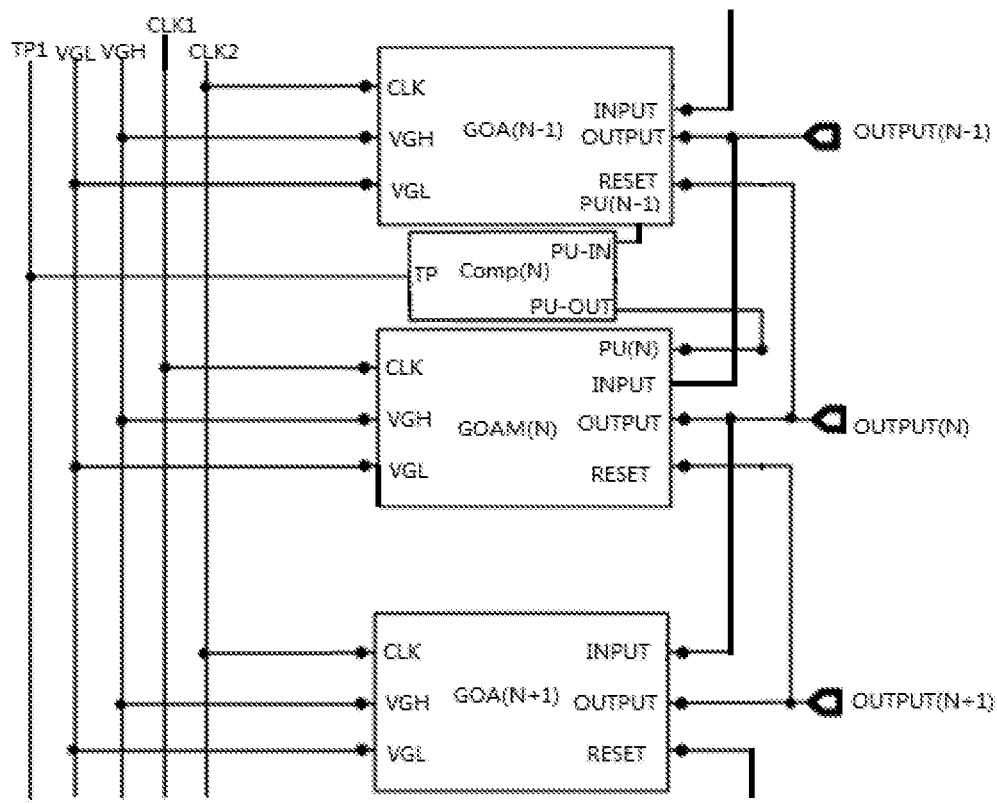
FIG. 4 is a schematic view showing a gate driving circuit according to one embodiment of the present disclosure.

As shown in FIG. 4, the gate driving circuit includes three levels of gate driving units, i.e., an $(N-1)^{th}$-level gate driving unit GOA(N−1), an $N^{th}$-level gate driving unit GOAM(N), and an $(N+1)^{th}$-level gate driving unit GOA(N+1), where N is a positive integer greater than 1. GOA(N−1) and GOA(N+1) are both conventional gate driving units, and GOAM(N) is the above-mentioned gate driving unit.

The $N^{th}$-level gate driving unit includes an $N^{th}$-level shift register unit circuit GOAM(N) and an $N^{th}$-level compensation circuit Comp(N). For GOA(N−1), GOA(N+1) and GOAM(N), OUTPUT represents the gate driving signal output end, RESET represents a shift resetting end, CLK represents the shift clock signal input end, and INPUT represents the input end.

In FIG. 4, VGH represents a high voltage, VGL represents a low voltage, PU(N−1) represents a pull-up node of GOA(N−1), and PU(N) represents a pull-up node of GOAM(N).

For Comp(N), PU-IN represents the pull-up input end, PU-OUT represents the pull-up node voltage output end, and TP represents the touch ending signal input end.

In FIG. 4, OUTPUT(N−1) represents an $(N-1)^{th}$-level gate driving signal output end, OUTPUT(N) represents an $N^{th}$-level gate driving signal output end, OUTPUT(N+1) represents an $(N+1)^{th}$-level gate driving signal output end, TP1 represents a first touch ending signal line, CLK1 represents a first clock signal line, and CLK2 represents a second clock signal line.

As shown in FIG. 4, PU-IN is connected to PU(N−1) of GOA(N−1), PU-OUT is connected to PU(N) of GOAM(N), and TP is connected to TP1. The shift clock signal input end of GOA(N−1) is connected to CLK2, the shift clock signal input end of GOAM(N) is connected to CLK1, and the shift clock signal input end of GOA(N+1) is connected to CLK2. OUTPUT(N) is connected to INPUT of GOA(N+1) and RESET of GOA(N−1).

When N is greater than 2, OUTPUT(N−1) is connected to a resetting end of an $(N-2)^{th}$-level gate driving unit, and OUTPUT(N+1) is connected to an input end of an $(N+2)^{th}$-level gate driving unit.

The compensation circuit Comp(N) has a structure as shown in FIG. 2.

Figure 5:
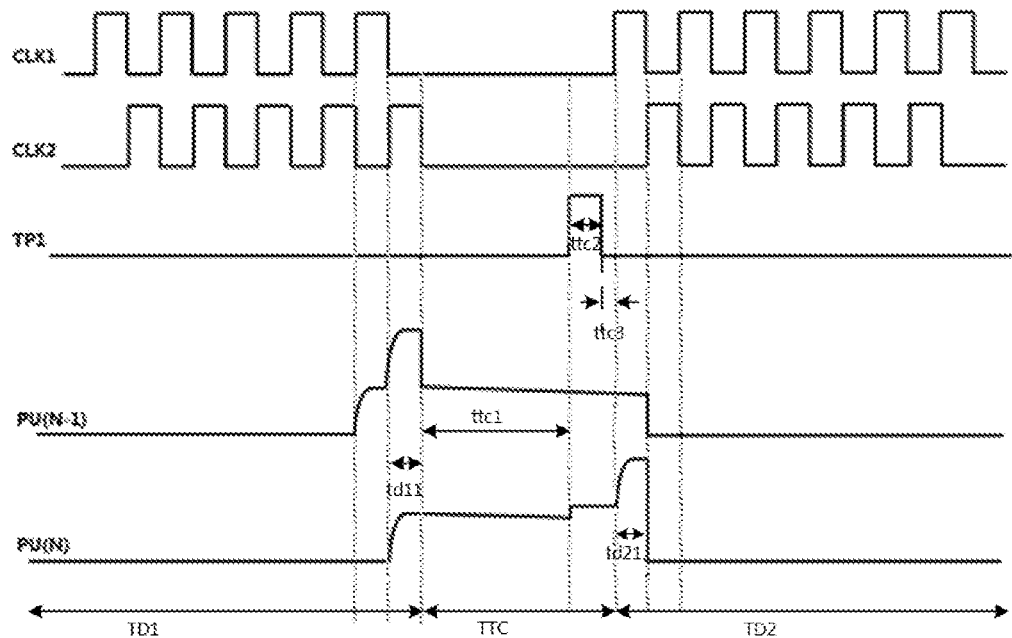
FIG. 5 is a sequence diagram of the gate driving circuit in FIG. 4.

As shown in FIG. 5, during the operation of the gate driving circuit in FIG. 4, within a last display time period td11 of a first display stage TD1, a high level is applied to CLK2, so a potential at PU(N−1) is a high level, and OUTPUT(N−1) outputs a corresponding gate driving signal. At a touch stage TTC subsequent to td11, a touch scanning operation is performed, and a gate driving scanning operation is stopped.

The touch stage TTC includes a maintenance time period ttc1, a voltage compensation time period ttc2 and a charging stop time period ttc3.

At TTC, a low level is applied to each of CLK1 and CLK2. Within ttc1, a low level is applied to TP1.

Within the maintenance time period ttc1, because the low level is applied to each of CLK1 and CLK2, OUTPUT(N) may output a low level, the potentials at PU(N−1) and PU(N) may be a high level, so M12 of Comp(N) may be turned on. However, because the low level is applied to TP, the potential at PU_CN may be maintained as a low level all the time. At this time, M13 of Comp(N) is turned off, and the potential at PU(N) may not be affected.

Within the voltage compensation time period ttc2, a high level (square wave) is applied to TP1, so M12 and M13 of Comp(N) are turned on, so as to charge PU(N). At this time, the potential at PU(N) is pulled up after a Long H Blank (LHB) time period (a duration of the touch stage between two display stages), so as to prevent the potential at the pull-up node from being pulled down due to current leakage within the long-term touch stage.

Within the charging stop time period ttc3, the touch ending signal from TP1 is changed from a high level to a low level again. At this time, the potential at PU_CN is pulled down, so as to turn off M13 and stop charging PU(N).

Within a first display time period td21 of a second display stage TD2 subsequent to ttc3, the first clock signal from CLK1 is changed to a high level, so as to enable GOAM(N). Within the remaining display time period of TD2, the gate driving units are turned on sequentially. At this time, it is able to ensure a display effect of a display panel when a proper data signal is applied.

For the gate driving circuit in FIG. 4, two clock signal lines are adopted, i.e., CLK1 and CLK2. CLK2 is connected to GOA(N−1) and GOA(N+1), and CLK1 is connected to GOAM(N), as shown in FIG. 5. At the first display stage TD1 and the second display stage TD2, a first clock signal applied to CLK1 has a phase opposite to a second clock signal applied to CLK2.

In actual use, the gate driving circuit in the embodiments of the present disclosure may be connected to 2n clock signal lines, where n is positive integer, e.g., 1, 2, 3 or 4.

In FIG. 5, the first clock signal applied to CLK1 is maintained at a high level for one clock period H, and it has a duty ratio of 1/2 at the display stage.

When n=2, the gate driving circuit is connected to the first clock signal line, the second clock signal line, a third clock signal line and a fourth clock signal line. At this time, GOA(N−1) may be connected to the first clock signal line, GOAM(N) may be connected to the second clock signal line, GOA(N+1) may be connected to the third clock signal line, and the $(N+2)^{th}$-level gate driving unit may be connected to the fourth clock signal line. The clock signals may be maintained at a high level or a low level for 2 H, and a current clock signal is delayed by 1 H as compared with a previous clock signal.

In actual use, the gate driving circuit may include at least two of the above-mentioned gate driving units.

Figure 6:
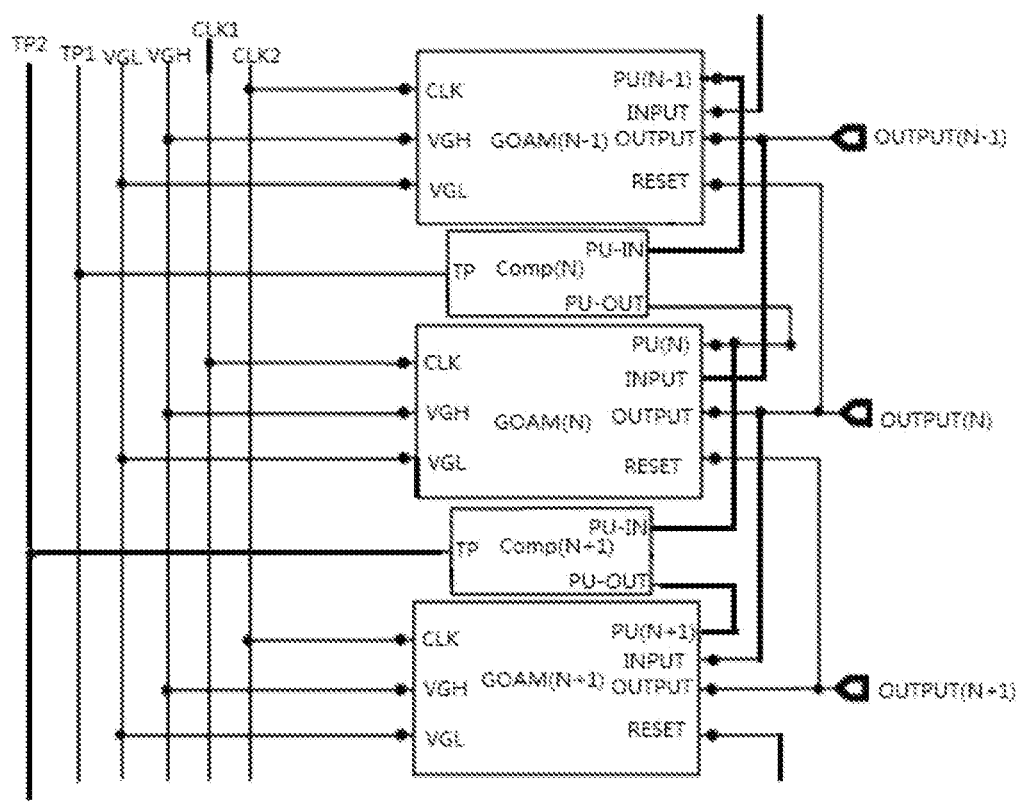
FIG. 6 is another schematic view showing the gate driving circuit according to one embodiment of the present disclosure.

As shown in FIG. 6, in a second embodiment, each gate driving unit of the gate driving circuit is the above-mentioned gate driving unit.

In FIG. 6, the gate driving circuit includes three levels of gate driving units, i.e., an $(N-1)^{th}$-level gate driving unit, an $N^{th}$-level gate driving unit, and an $(N+1)^{th}$-level gate driving unit, where N is an integer greater than 1.

The $(N-1)^{th}$-level gate driving unit includes an $(N-1)^{th}$-level shift register unit circuit GOAM(N−1) and an $(N-1)^{th}$-level compensation circuit (not shown). The $N^{th}$-level gate driving unit includes an $N^{th}$-level shift register unit circuit GOAM(N) and an $N^{th}$-level compensation circuit Comp(N). The $(N+1)^{th}$-level gate driving unit includes an $(N+1)^{th}$-level shift register unit circuit GOAM(N+1) and an $(N+1)^{th}$-level compensation circuit Comp(N+1).

Each shift register unit circuit includes the pull-up node PU, the gate driving signal output end OUTPUT, the shift clock signal input end CLK, the shift resetting end RESET and the input end INPUT. Each compensation circuit includes the pull-up input end PU-IN, the pull-up node voltage output end PU-OUT and the touch ending signal input end TP.

In FIG. 6, VGH represents a high voltage, VGL represents a low voltage, PU(N−1) represents a pull-up node of GOAM(N−1), PU(N) represents a pull-up node of GOAM(N), PU(N+1) represents a pull-up node of GOAM(N+1), OUTPUT(N−1) represents an $(N-1)^{th}$-level gate driving signal output end, OUTPUT(N) represents an $N^{th}$-level gate driving signal output end, OUTPUT(N+1) represents an $(N+1)^{th}$-level gate driving signal output end, TP1 represents a first touch ending signal line, TP2 represents a second touch ending signal line, CLK1 represents a first clock signal line and CLK2 represents a second clock signal line.

A shift clock signal line of GOAM(N−1) is connected to CLK2, and a shift resetting end of GOAM(N−1) is connected to OUTPUT(N). A pull-up input end of Comp(N) is connected to PU(N−1), a pull-up node voltage output end thereof is connected to PU(N), and a touch ending signal input end thereof is connected to TP1. An input end of GOAM(N) is connected to OUTPUT(N−1), a shift resetting end thereof is connected to OUTPUT(N+1), and a shift clock signal input end thereof is connected to CLK1. A pull-up input end of Comp(N+1) is connected to PU(N), a pull-up node voltage output end thereof is connected to PU(N+1), and a touch ending signal input end thereof is connected to TP2. An input end of GOAM(N+1) is connected to OUTPUT(N), and a shift clock signal input end thereof is connected to CLK2.

When N is greater than 2, OUTPUT(N−1) is connected to a resetting end of an $(N-2)^{th}$-level gate driving unit, and OUTPUT(N+1) is connected to an input end of an $(N+2)^{th}$-level gate driving unit.

For the gate driving circuit in FIG. 6, each compensation circuit has a structure as shown in FIG. 2.

During the operation of the gate driving circuit in FIG. 6, a wave form of the shift clock signal applied to the shift clock signal line (i.e., a clock signal line connected to the shift clock signal input end CLK-IN) and a wave form of the touch ending signal applied to the touch ending signal line may be changed, so as to determine a time point when the touch operation is performed.

Figure 7:
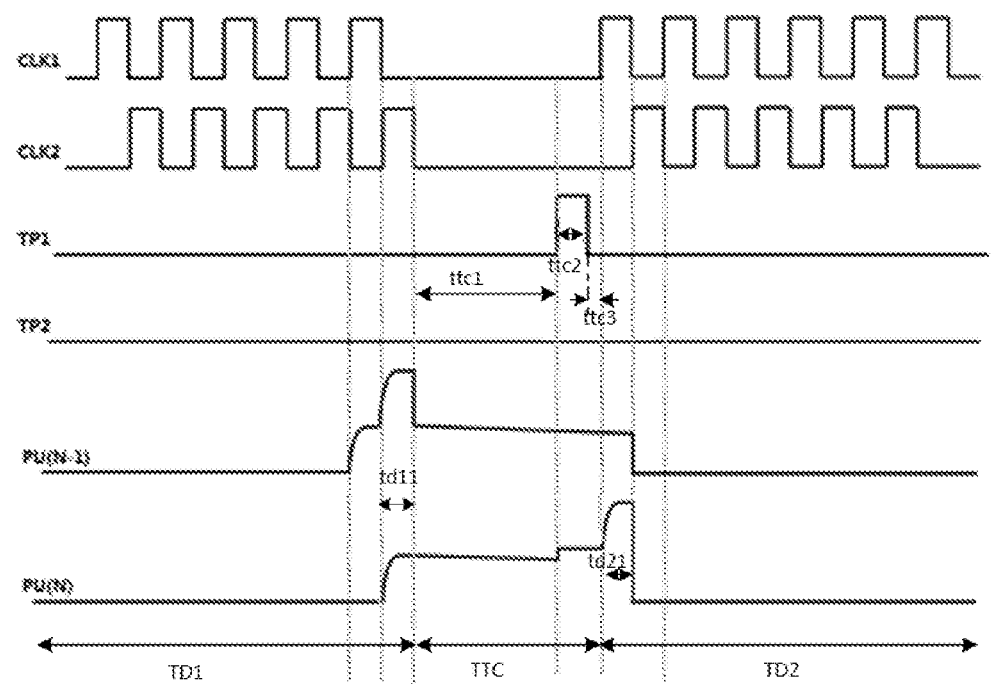
FIG. 7 is a sequence diagram of the gate driving circuit in FIG. 6.

As shown in FIG. 7, after a corresponding gate driving signal has been outputted from GOAM(N−1), a potential of a second clock signal applied to CLK2 connected to the shift clock signal input end of GOAM(N−1), a potential of a first cock signal applied to CLK1 connected to the shift clock signal input end of GOA(N), a potential at the first touch ending signal line TP1 connected to the touch ending signal input end of Comp(N) and a potential at the second touch ending signal line TP2 connected to the touch ending signal input end of Comp(N+1) may be each set as a low level, so as to end the display stage and start the touch stage.

When the touch stage is about to be ended, the potential at TP1 may be set as a high level, so as to pull up the potential at PU(N) through the compensation circuit, thereby to enable the GOAM(N) to output the corresponding gate driving signal normally at a next display stage, and prevent the occurrence of display abnormality when potential at PU(N) is pulled down at the touch stage. At the next display stage, each shift clock signal line may output the corresponding clock signal normally, and each touch ending signal line may output a low level.

As shown in FIG. 7, during the operation of the gate driving circuit in FIG. 6, within the last display time period td11 of the first display stage TD1, a high level is applied to CLK2, so the potential at PU(N−1) is a high level, and the OUTPUT(N−1) outputs the corresponding gate driving signal.

At the touch stage TTC subsequent to td11, a scanning operation is performed, and a gate driving scanning operation is stopped.

The touch stage TTC includes the maintenance time period ttc1, the voltage compensation time period ttc2 and the charging stop time period ttc3.

At TTC, a lower level is applied to each of CLK1, CLK2 and TP2. Within ttc1, a low level is applied to TP1. Within the maintained time period ttc1, because the low level is applied to each of CLK1 and CLK2, OUTPUT(N) outputs a low level, the potential at each of PU(N−1) and PU(N) is a high level, and M12 of Comp(N) is turned on. However, because the low level is applied to TP, the potential at PU_CN is maintained at a low level all the time. At this time, M13 of Comp(N) is turned off, and the potential at PU(N) may not be affected.

Within the voltage compensation time period ttc2, a high level (square wave) is applied to TP1, so M12 and M13 of Comp(N) are turned on, so as to charge PU(N) and pull up the potential at PU(N) after the LHB time period, thereby to prevent the potential at the pull-up node from being pulled down after the long-term touch stage.

Within the charging stop time period ttc3, the touch ending signal from TP1 is changed from a high level to a low level again. At this time, the potential at PU_CH is pulled down, so M13 is turned off and PU(CH) is not charged any more.

Within the first display time period td21 of the second display stage TD2 subsequent to ttc3, the second clock signal applied to CLK1 is changed to be at a high level. At this time, GOAM(N) is enabled, so as to output the corresponding gate driving signal and pull down the potential at PU(N−1). Within the remaining display time period of TD2, the gate driving units are turned on sequentially. At this time, it is able to ensure the display effect of the display panel when the proper data signal is applied.

For the gate driving circuit in FIG. 6, TP1 and TP2 are used to control two adjacent compensation circuits respectively, so as to enable the potential at the pull-up control node PU_CN of the compensation circuit of the $(N+1)^{th}$-level gate driving unit to be a low level when charging the compensation circuit of the $N^{th}$-level gate driving unit, thereby to prevent the potential at the pull-up node of the shift register unit circuit of the $(N+1)^{th}$-level gate driving unit from being affected.

According to the gate driving circuit in the second embodiment of the present disclosure, through the newly-added compensation circuit, it is able for the gate driving circuit to output the gate driving signal normally after the touch operation. In addition, through changing a wave form of the touch ending signal from the touch ending signal line and a wave form of the shift clock signal from the shift clock signal line as well as providing the corresponding data signal, it is able to perform a touch operation after a scanning operation made by each gate driving unit, and meanwhile ensure an output effect of the gate driving signal.

For the gate driving circuit in FIG. 6, two clock signal lines are adopted, i.e., CLK1 and CLK2. CLK2 is connected to GOAM(N−1) and GOAM(N+1), and CLK1 is connected to GOAM(N), as shown in FIG. 7. At the first display stage TD1 and the second display stage TD2, a first clock signal applied to CLK1 has a phase opposite to a second clock signal applied to CLK2.

In actual use, the gate driving circuit in the embodiments of the present disclosure may be connected to 2n clock signal lines, where n is positive integer, e.g., 1, 2, 3 or 4.

In FIG. 7, the first clock signal applied to CLK1 is maintained at a high level for one clock period H, and it has a duty ratio of 1/2 at the display stage.

When n=2, the gate driving circuit is connected to the first clock signal line, the second clock signal line, a third clock signal line and a fourth clock signal line. At this time, GOAM(N−1) may be connected to the first clock signal line, GOAM(N) may be connected to the second clock signal line, GOAM(N+1) may be connected to the third clock signal line, and the $(N+2)^{th}$-level gate driving unit may be connected to the fourth clock signal line. The clock signals may be maintained at a high level or a low level for 2 H, and a current clock signal is delayed by 1 H as compared with a previous clock signal.

In actual use, for the gate driving circuit in the second embodiment of the present disclosure, when 2n clock signal lines are adopted, 2n touch ending signal lines may be adopted too. The 2n clock signal lines may be connected to the shift clock signal input ends of the adjacent 2n levels of shift register unit circuit respectively, and one touch ending signal line corresponds to one clock signal line. The 2n clock signal lines may be further connected to the touch ending signal input ends of the adjacent 2n levels of compensation circuits respectively. When it is necessary to apply a high level to the touch ending signal input end of a certain compensation circuit so as to pull up the potential at the corresponding pull-up node, a low level may be applied to each of the other touch ending signal lines, so as to prevent the potential at the pull-up node of any other shift register unit circuit from being pulled up by mistake, thereby to ensure the display effect.

The present disclosure further provides in some embodiments a gate driving method for use in the above-mentioned gate driving circuit. Each driving period includes a touch stage, and the touch stage includes a maintenance time period and a voltage compensation time period. The gate driving method includes steps of: entering the touch stage after a corresponding gate driving signal is outputted by a current-level gate driving unit; performing a touch scanning operation at the touch stage; within the maintenance time period of the touch stage, maintaining, by a compensation circuit of a next-level gate driving unit, a potential at a pull-up node voltage output end of the compensation circuit under the control of a pull-up node of a current-level gate driving unit and a touch ending signal input end of the compensation circuit of the next-level gate driving unit; and within the voltage compensation time period of the touch stage, pulling, by the compensation circuit, the potential at the pull-up node voltage output end under the control of the pull-up node and the touch ending signal input end, so as to pull up the potential at the pull-up node through the pull-up node voltage output end of the compensation circuit even when the potential at the pull-up node of the gate driving unit is pulled down due to the touch stage or the low-frequency output, thereby to enable the gate driving unit to output the corresponding gate driving signal normally and prevent the display effect from being adversely affected.

To be specific, each driving period further includes a display stage subsequent to the voltage compensation time period. The gate driving method further includes: at the display stage, stopping the touch scanning operation; and within a first-row display time period of the display stage, outputting, by a shift register unit circuit of the next-level gate driving unit, a corresponding gate driving signal under the control of the pull-up node voltage output end.

To be specific, the gate driving method further includes enabling the gate driving circuit to start and end the touch stage through a shift clock signal line and a touch ending signal line.

According to the gate driving method in the embodiments of the present disclosure, through changing a wave form of the touch ending signal from the touch ending signal line and a wave form of the shift clock signal from the shift clock signal line as well as providing the corresponding data signal, it is able to perform a touch operation after a scanning operation made by each gate driving unit, start the next display stage subsequent to the touch stage, and ensure an output effect of the gate driving signal.

The present disclosure further provides in some embodiments a display device including the above-mentioned gate driving circuit.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A gate driving unit, comprising a shift register unit circuit and a compensation circuit
   wherein the compensation circuit comprises:
   a touch ending signal input end, a pull-up input end and a pull-up node voltage output end;
   a pull-up control node control sub-circuit connected to the touch ending signal input end, the pull-up input end and a pull-up control node, and configured to control the touch ending signal input end to input a touch ending signal to the pull-up control node under the control of the pull-up input end;
   a pull-up control storage capacitor sub-circuit, a first end of the pull-up control storage capacitor sub-circuit is connected to the pull-up input end, and a second end of the pull-up control storage capacitor sub-circuit is connected to the pull-up control node; and
   a compensation sub-circuit connected to the pull-up control node and the pull-up node voltage output end, and configured to enable the pull-up control node to be electrically connected to the pull-up node voltage output end under the control of the pull-up control node,
   wherein a pull-up input end of the compensation circuit is connected to a pull-up node of a previous-level gate driving unit, a pull-up node output end of the compensation circuit is connected to a pull-up node of the shift register unit circuit, and a touch ending signal input end of the compensation circuit is connected to a touch ending signal line, wherein the shift register unit circuit comprises an input end, a resetting end, a clock signal input end, the pull-up node, a pull-down node, a gate driving signal output end, an input sub-circuit, a pull-up resetting sub-circuit, a pull-up node control sub-circuit, a pull-down node control sub-circuit, a shift storage capacitor sub-circuit, an output sub-circuit and an output resetting sub-circuit;

the input sub-circuit is connected to the input end, a first voltage input end and the pull-up node, and configured to control the first voltage input end to input a first voltage to the pull-up node under the control of the input end;

the pull-up resetting sub-circuit is connected to the resetting end, a second voltage input end and the pull-up node, and configured to control the second voltage input end to input a second voltage to the pull-up node under the control of the resetting end;

the pull-up node control sub-circuit is connected to the pull-up node, the pull-down node and a third voltage input end, and configured to control the third voltage input end to input a third voltage to the pull-up node under the control of the pull-down node;

the pull-down node control sub-circuit is connected to the pull-up node, the pull-down node, the third voltage input end and a fourth voltage input end, and configured to control a potential at the pull-down node under the control of the pull-up node;

a first end of the shift storage capacitor sub-circuit is connected to the pull-up node, and a second end of the shift storage capacitor sub-circuit is connected to the gate driving signal output end;

the output sub-circuit is connected to the gate driving signal output end, the pull-up node and the clock signal input end, and configured to control the clock signal input end to input a clock signal to the gate driving signal output end under the control of the pull-up node;

the output resetting sub-circuit is connected to the gate driving signal output end, the pull-down node and the third voltage input end, and configured to control the third voltage input end to output the third voltage to the gate driving signal output end under the control of the pull-down node;

the input end is connected to a gate driving signal output end of the previous-level gate driving unit; and the resetting end is connected to a gate driving signal output end of a next-level gate driving unit, wherein the first voltage is a first high voltage, the second voltage is a first low voltage, the third voltage is a second low voltage, and a fourth voltage from the fourth voltage input end is a second high voltage.

2. A method for driving the gate driving unit according to claim 1, comprising a step of controlling, by a compensation circuit, a potential at a pull-up node voltage output end under the control of a pull-up input end and a touch ending signal input end, so as to control a potential at a pull-up node of a shift register unit circuit of the gate driving unit.

3. The method according to claim 2, wherein each driving period comprises at least one touch stage, and the touch stage comprises a maintenance time period and a voltage compensation time period, wherein the method comprises:

within the maintenance time period of the touch stage, maintaining, by the compensation circuit, the potential at the pull-up node voltage output end under the control of the pull-up input end and the touch ending signal input end; and within the voltage compensation time period of the touch stage, pulling up, by the compensation circuit, the potential at the pull-up node voltage output end under the control of the pull-up input end and the touch ending signal input end.

4. The method according to claim 2, wherein the shift register unit circuit of the gate driving unit comprises an input end, a resetting end, a clock signal input end, the pull-up node, a pull-down node, a gate driving signal output end, an input sub-circuit, a pull-up resetting sub-circuit, a pull-up node control sub-circuit, a pull-down node control sub-circuit, a shift storage capacitor sub-circuit, an output sub-circuit and an output setting sub-circuit, each driving period further includes a display stage, wherein the method further comprises:

within an input time period of the display stage, pulling up, by the input sub-circuit, the potential at the pull-up node under the control of the input end;

within an output time period of the display stage, bootstrapping, by the shift storage capacitor sub-circuit, the potential at the pull-up node, and controlling, by the output sub-circuit, the clock signal input end to input a clock signal to the gate driving signal output end, so as to output a corresponding gate driving signal through the gate driving signal output end; and within a resetting time period of the display stage, resetting, by the pull-up resetting sub-circuit, the potential at the pull-up node under the control of the resetting end, pulling up, by the pull-down node control sub-circuit, a potential at the pull-down node, maintaining, by the pull-up node control sub-circuit, the potential at the pull-up node, and resetting, by the output resetting sub-circuit, the gate driving signal under the control of the pull-down node.

5. A method for driving the gate driving unit according to claim 1, comprising a step of controlling, by a compensation circuit, a potential at a pull-up node voltage output end under the control of a pull-up input end and a touch ending signal input end, so as to control a potential at a pull-up node of a shift register unit circuit of the gate driving unit.

6. A gate driving circuit comprising at least one level of the gate driving unit according to claim 1.

7. A gate driving method for use in the gate driving circuit according to claim 6, wherein each driving period comprises a touch stage, and the touch stage comprises a maintenance time period and a voltage compensation time period, wherein the gate driving method comprises steps of:

entering the touch stage after a corresponding gate driving signal is outputted by a current-level gate driving unit;

performing a touch scanning operation at the touch stage;

within the maintenance time period of the touch stage, maintaining, by a compensation circuit of a next-level gate driving unit, a potential at a pull-up node voltage output end of the compensation circuit under the control of a pull-up node of the current-level gate driving unit and a touch ending signal input end of the compensation circuit of the next-level gate driving unit; and within the voltage compensation time period of the touch stage, pulling, by the compensation circuit, the potential at the pull-up node voltage output end under the control of the pull-up node and the touch ending signal input end.

8. The gate driving method according to claim 7, wherein each driving period further comprises a display stage subsequent to the voltage compensation time period, wherein the gate driving method further comprises:

at the display stage, stopping the touch scanning operation; and within a first-row display time period of the display stage, outputting, by a shift register unit circuit of the next-level gate driving unit, a corresponding gate driving signal under the control of the pull-up node voltage output end.

9. The gate driving method according to claim 7, further comprising enabling the gate driving circuit to start and end the touch stage through a shift clock signal line and a touch ending signal line.

10. A display device comprising the gate driving circuit according to claim 6.

11. The gate driving unit according to claim 1, wherein the pull-up control node control sub-circuit comprises a pull-up node control transistor, a gate electrode of the pull-up node control transistor is connected to the pull-up input end, a first electrode of the pull-up node control transistor is connected to the touch ending signal input end, and a second electrode of the pull-up node control transistor is connected to the pull-up control node.

12. The gate driving unit according to claim 1, wherein the compensation sub-circuit comprises a compensation transistor, a gate electrode and a first electrode of the compensation transistor are connected to the pull-up control node, and a second electrode of the compensation transistor is connected to the pull-up node voltage output end.

13. The gate driving unit according to claim 1, wherein the pull-up control storage capacitor sub-circuit comprises a pull-up control storage capacitor, a first end of the pull-up control storage capacitor is connected to the pull-up input end, and a second end of the pull-up control storage capacitor is connected to the pull-up control node.

* * * * *